United States Patent
Wong

(10) Patent No.: US 7,400,178 B2
(45) Date of Patent: Jul. 15, 2008

(54) DATA OUTPUT CLOCK SELECTION CIRCUIT FOR QUAD-DATA RATE INTERFACE

(75) Inventor: Tak Kwang (Dino) Wong, Milpitas, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 171 days.

(21) Appl. No.: 11/278,368

(22) Filed: Mar. 31, 2006

(65) Prior Publication Data

US 2007/0234251 A1 Oct. 4, 2007

(51) Int. Cl.
*H03L 7/00* (2006.01)
*H03K 5/01* (2006.01)
*H03K 19/00* (2006.01)
*G06F 1/12* (2006.01)
*G06F 1/00* (2006.01)
*G06F 1/04* (2006.01)
*G06F 17/50* (2006.01)
*H04L 7/00* (2006.01)

(52) U.S. Cl. .......................... 327/142; 716/6; 713/400; 326/93; 714/814

(58) Field of Classification Search ................... 326/93; 327/142, 165, 166; 713/400, 500, 600; 714/814–815; 716/6

See application file for complete search history.

(56) References Cited

U.S. PATENT DOCUMENTS

| | | | | |
|---|---|---|---|---|
| 6,651,231 | B2 * | 11/2003 | Morikawa | 716/6 |
| 6,844,764 | B2 * | 1/2005 | Xiao et al. | 327/165 |
| 6,891,409 | B2 * | 5/2005 | Furuya | 327/141 |
| 7,334,152 | B2 * | 2/2008 | Morigaki | 713/503 |
| 2002/0070776 | A1 * | 6/2002 | Ishiwaki | 327/142 |
| 2003/0131276 | A1 * | 7/2003 | Dixon et al. | 713/500 |
| 2004/0085109 | A1 * | 5/2004 | Hariharan et al. | 327/165 |
| 2004/0246035 | A1 * | 12/2004 | Karatani et al. | 327/165 |
| 2005/0110545 | A1 * | 5/2005 | Mahrla | 327/165 |
| 2005/0138458 | A1 * | 6/2005 | Smith et al. | 713/600 |
| 2005/0179476 | A1 * | 8/2005 | Sweet | 327/142 |

* cited by examiner

*Primary Examiner*—Stacy Whitmore
(74) *Attorney, Agent, or Firm*—Bever, Hoffman & Harms LLP

(57) ABSTRACT

A method for selecting a data output clock signal includes providing a complementary output clock signal pair to a combinational logic circuit, thereby generating a reset control signal. The reset control signal is activated if the complementary output clock signals have different values, and deactivated if these clock signals have the same predetermined value. The activated reset control signal asynchronously resets a pair of series connected flip-flops. The deactivated reset control signal enables the flip-flops to synchronously propagate a fixed logic signal in response to a clock signal of a complementary input clock signal pair. The output signal of the series-connected flip-flops is used to select the data output clock signal from the first complementary clock signal pair and the second complementary clock signal pair.

15 Claims, 5 Drawing Sheets

US 7,400,178 B2

DATA OUTPUT CLOCK SELECTION CIRCUIT FOR QUAD-DATA RATE INTERFACE

FIELD OF THE INVENTION

The present invention relates to a circuit for selecting an internal clock, which is used to transfer data out of a data system.

BACKGROUND OF THE INVENTION

In a typical quad-data rate system, an internally selected clock signal pair (EC/EC#) is used to output data. That is, the output data is synchronized with the internally selected clock signal pair EC/EC#. The internally selected clock signal pair EC/EC# includes a pair of complementary clock signals, namely, clock signal EC, and complementary clock signal EC#. This terminology is used throughout the present specification. The internally selected clock signal pair EC/EC# is typically selected from either an input clock signal pair K/K# or an output clock signal pair C/C#. Input clock signal pair K/K# typically controls and aligns the timing of the input signals to the system, while output clock signal pair C/C# typically controls and aligns the timing of the output signals from the system. (Thus, 'output' clock signals C and C# are actually input signals.)

FIG. 1 is a schematic diagram of a simple circuit 100 for providing either an input clock signal pair K/K# or an output clock signal pair C/C# as the internally selected clock signal pair EC/EC#. Circuit 100 includes logical AND gate 101 and multiplexer 102. AND gate 101 is coupled to receive the output clock signals C and C# of the output clock signal pair C/C#. If the both of the output clock signals C and C# have a logic high state (e.g., are tied to the $V_{DD}$ supply voltage), then AND gate 101 will provide a clock pulse signal $C_{PULSE}$ having a logic "1" state. Otherwise, the clock pulse signal $C_{PULSE}$ has a logic "0" state.

The clock pulse signal $C_{PULSE}$ is applied to the control terminal of multiplexer 102. If the clock pulse signal $C_{PULSE}$ signal has a logic '1' state, then multiplexer 102 routes the input clock signal pair K/K# as the internally selected clock signal pair EC/EC#. Conversely, if the clock pulse signal $C_{PULSE}$ has a logic '0' state, then multiplexer 102 routes the output clock signal pair C/C# as the internally selected clock signal pair EC/EC#.

The internally selected clock signal pair EC/EC# is provided to data output circuit 103. In response, data output circuit 103 transfers received data values DI as output data values DO. In a typical high speed application, the data output circuit 103 includes a delay locked loop (DLL), which aligns the output data values DO to the internally selected clock signal pair EC/EC#.

FIG. 2 is a waveform diagram illustrating conventional output clock signals C and C#. The output clock signal pair C/C# (and the input clock signal pair K/K#) must conform to certain specifications. For example, each of the output clock signals C and C# typically requires a duty cycle in the range of 40 to 60 percent of one period of the clock cycle ($T_{CYCLE}$). In addition, within the output clock signal pair C/C#, the time between the rising edges of the output clock signal C and the rising edges of the complementary clock signal C# is typically required to be in the range of 45 to 55 percent of $T_{CYCLE}$. Hence, it is possible for the output clock signal C and the complementary output clock signal C# to have a logic '1' state for up to 15 percent of the period $T_{CYCLE}$. In this case, a pulse filter capable of filtering a pulse width greater than 0.15×$T_{CYCLE}$ is required to ensure that the clock signal C and the complementary clock signal C# are not simultaneously detected in a logic '1' state. Failure to filter in this manner would result in the system erroneously providing the input clock signal K/K# as the internally selected clock signal EC/EC#.

Given the above-described clock specifications, it is possible for the erroneous logic '1' pulses of clock pulse signal $C_{PULSE}$ to be separated in time by 40% of the period $T_{CYCLE}$ or more. Thus, the pulse filter is also required to filter pulses having a separation greater than or equal to 0.4×$T_{CYCLE}$. Failure to filter in this manner would result in the system erroneously providing the input clock signal K/K# as the internally selected clock signal EC/EC#.

FIG. 3 is a circuit diagram of a conventional circuit 300 for solving the above-identified problems. Circuit 300 adds delay chain 301 and logical AND gate 302 between the logical AND gate 101 and the multiplexer 102 of FIG. 1. One input of AND gate 302 is coupled to receive the clock pulse signal $C_{PULSE}$, and the other input of AND gate 302 is coupled to receive a delayed clock pulse signal $C_{PULSE\_D}$, which is a delayed version of the clock pulse signal $C_{PULSE}$. The delayed clock pulse signal $C_{PULSE\_D}$ is created by routing the clock pulse signal $C_{PULSE}$ through delay chain 301. AND gate 302 provides a clock select signal SELK in response to the $C_{PULSE}$ and $C_{PULSE\_D}$ signals. In order for circuit 300 to operate without providing undesired glitches in the clock select signal SELK, delay circuit 301 must introduce a delay ($T_{DELAY}$) with a duration greater than 0.15×$T_{CYCLE}$ and less than 0.4×$T_{CYCLE}$. The delay $T_{DELAY}$ must have a duration greater than 0.15×$T_{CYCLE}$ to prevent short glitches in the clock pulse signal $C_{PULSE}$ (as illustrated by the logic '1' states of the $C_{PULSE}$ signal in FIG. 2) from being transmitted to the clock select signal SELK. The delay $T_{DELAY}$ must also have a duration less than 0.4×$T_{CYCLE}$ to ensure that a logic '1' glitch in the delayed clock pulse signal $C_{PULSE\_D}$ is no longer being provided to AND gate 302 at the same time that a current glitch in the clock pulse signal $C_{PULSE}$ may exist. That is, a delay $T_{DELAY}$ having a duration less than 0.4×$T_{CYCLE}$ prevents the delayed version of a first glitch in the $C_{PULSE}$ signal from interacting with a subsequent glitch in the $C_{PULSE}$ signal.

The limited range of acceptable delays within delay chain 301 has several disadvantages. First, circuit 300 will only work in a frequency range of 0.15/$T_{DELAY}$ (minimum frequency) to 0.4/$T_{DELAY}$ (maximum frequency). Second, the delay introduced by delay chain 301 will vary with voltage, temperature and process, thereby narrowing the frequency range even further. For example, if the maximum delay is equal to 1.5 times the minimum delay (due to voltage, temperature and process variations), and the highest frequency of operation is equal to 250 MHz, then the lowest frequency of operation is limited to 250 MHz×1.5×0.15/0.4=141 MHz.

While there are circuit modifications that can alleviate this problem (e.g., using analog techniques to get a relatively constant delay $T_{DELAY}$; using an unsymmetrical delay circuit that delays a logic '1' signal much more than a logic '0' signal), these circuit modifications will not eliminate the frequency dependency problem altogether.

It would therefore be desirable to have an output clock selection circuit that overcomes the above-described deficiencies.

SUMMARY

Accordingly, the present invention provides an improved method and apparatus for selecting a data output clock signal pair EC/EC# from a complementary output clock signal pair C/C# and a complementary input clock signal pair K/K#. Within the data output clock select signal of the present invention, the output clock signals C and C# of the complementary output clock signal pair are provided to a combinational logic circuit, such as a logical AND circuit. The logical AND circuit generates a reset control signal in response to the output clock signals C and C#. The reset control signal is activated if the output clock signals C and C# have different values, and deactivated if these output clock signals C and C# have the same value.

Thus, the reset control signal is largely activated if the output clock signal C and C# are free running. Note that the reset control signal may be de-activated during short periods while the output clock signals are free running due to variations in the output clock signals C and C# (as illustrated in FIG. 2). Tying the output clock signals C and C# to the same voltage will deactivate the reset control signal.

The reset control signal is applied to reset terminals of a first sequential logic circuit and a second sequential logic circuit. The first and second sequential logic circuits are connected in series, with the output of the second sequential logic circuit providing a clock select signal SEL_K. In one embodiment, the first and second sequential logic circuits are DQ flip-flops.

When the reset control signal is activated, the first and second sequential logic circuits are asynchronously reset to provide logic '0' output signals in response to an activated reset control signal. The logic '0' output signal provided by the second sequential logic circuit causes the complementary output clock signal pair C/C# to be routed as the data output clock signal pair EC/EC#. Although the reset control signal may be de-activated during short periods when the output clock signals C and C# are free running, these short deactivation periods are not sufficiently long or frequent enough to create a glitch in the logic '0' output signal provided by the second sequential logic circuit.

When the reset control signal is deactivated, the first and second sequential logic circuits are allowed to synchronously propagate a logic '1' data value in response to the input clock signal K (or, alternately, the input clock signal K#). When the output clock signals C and C# are tied to the same predetermined logic state (e.g., a logic '1' state) for two or more consecutive rising edges of the input clock signal K, the logic '1' data value propagates to the output terminal of the second sequential logic circuit. This logic '1' output signal causes the complementary input clock signal pair K/K# to be routed as the data output clock signal pair EC/EC#.

The present invention advantageously eliminates glitches the data output clock signal pair EC/EC# due to normal variations in the complementary output clock signal pair C/C#. Consequently, the data output clock select circuit of the present invention is not frequency-limited. In addition, the data output clock select circuit of the present invention can be implemented using available conventional circuit elements. Moreover, the required layout area of the data output clock select circuit of the present invention is less than the required layout area of a conventional data output clock select circuit, because no delay chain is required.

The present invention will be more fully understood in view of the following description and drawings.

DETAILED DESCRIPTION

Figure 4:
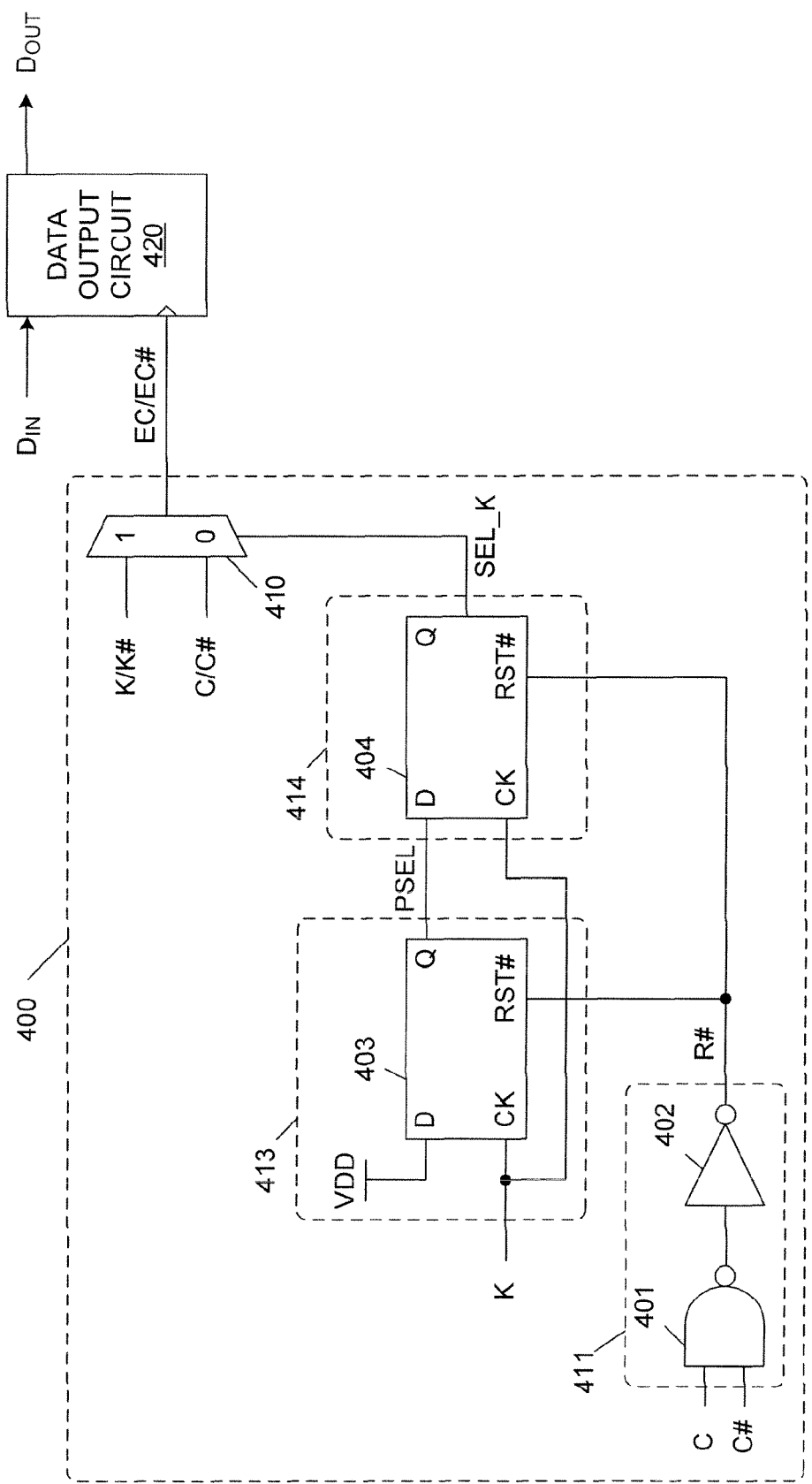
FIG. 4 is a circuit diagram of a data output clock selection circuit in accordance with one embodiment of the present invention.

FIG. 4 is a circuit diagram of a data output clock selection circuit 400 in accordance with one embodiment of the present invention. Data output clock selection circuit 400 includes multiplexer 410, combinational logic circuit 411, and sequential logic circuits 413-414. In the described embodiments, combinational logic circuit 411 is a logical AND circuit formed by logical NAND gate 401 and inverter 402. Sequential logic circuits 413 and 414 are implemented by D-Q flip-flops 403 and 404, respectively, in the described embodiments.

Logical NAND gate 401 includes a pair of input terminals coupled to receive the output clock signals C and C# (of output clock signal pair C/C#). The output terminal of NAND gate 401 is coupled to an input terminal of inverter 402. Inverter 402 provides a reset control signal R# to the reset input terminals RST# of flip-flops 403 and 404. When the output of inverter 402 has a logic '0' state, flip-flops 403 and 404 are asynchronously reset. When reset, each of flip-flops 403 and 404 provides an output signal (Q) having a logic '0' state.

The D input terminal of flip-flop 403 is coupled to receive the positive supply voltage ($V_{DD}$) (i.e., a logic '1' value). The Q output terminal of flip-flop 403 provides a preliminary select signal PSEL to the D input terminal of flip-flop 404. The clock input terminals of flip-flops 403 and 404 are commonly coupled to the input clock signal K (of input clock signal pair K/K#). In an alternate embodiment, the clock input terminals of flip-flops 403 and 404 are coupled to receive the complementary input clock signal K#. The Q output terminal of flip-flop 404 provides the data output clock select signal SEL_K to the control terminal of multiplexer 410. Multiplexer 410 includes a first set of input terminals coupled to receive the input clock signal pair K/K#, and a second set of input terminals coupled to receive the output clock signal pair C/C#. Multiplexer 410 routes one of the received clock signal pairs K/K# or C/C# to data output circuit 420 as the data output clock signal pair EC/EC#. Data output circuit 420 routes input data values $D_{IN}$ as output data values $D_{OUT}$ in response to the data output clock signal pair EC/EC#. More specifically, in a typical high speed application, the data output circuit 420 includes a delay locked loop (DLL), which aligns the output data values DO to the internally selected clock signal pair EC/EC#.

Data output clock selection circuit 400 operates as follows in accordance with one embodiment of the present invention. If both output clock signals C and C# (of the output clock signal pair C/C#) are tied to the same predetermined logic state (e.g., a logic '1' state) for at least two consecutive rising edges of the input clock signal K, then the input clock signal pair K/K# will be routed as the data output clock signal pair EC/EC#. If the output clock signals C and C# are free running (i.e., periodically transitioning between logic '0' and '1' states), then the output clock signal pair C/C# will be routed as the data output clock signal pair EC/EC#. In the described embodiments, free running output clock signals C and C# operate at the specifications described above in connection with FIG. 2 (although this is not necessary).

Figure 5:
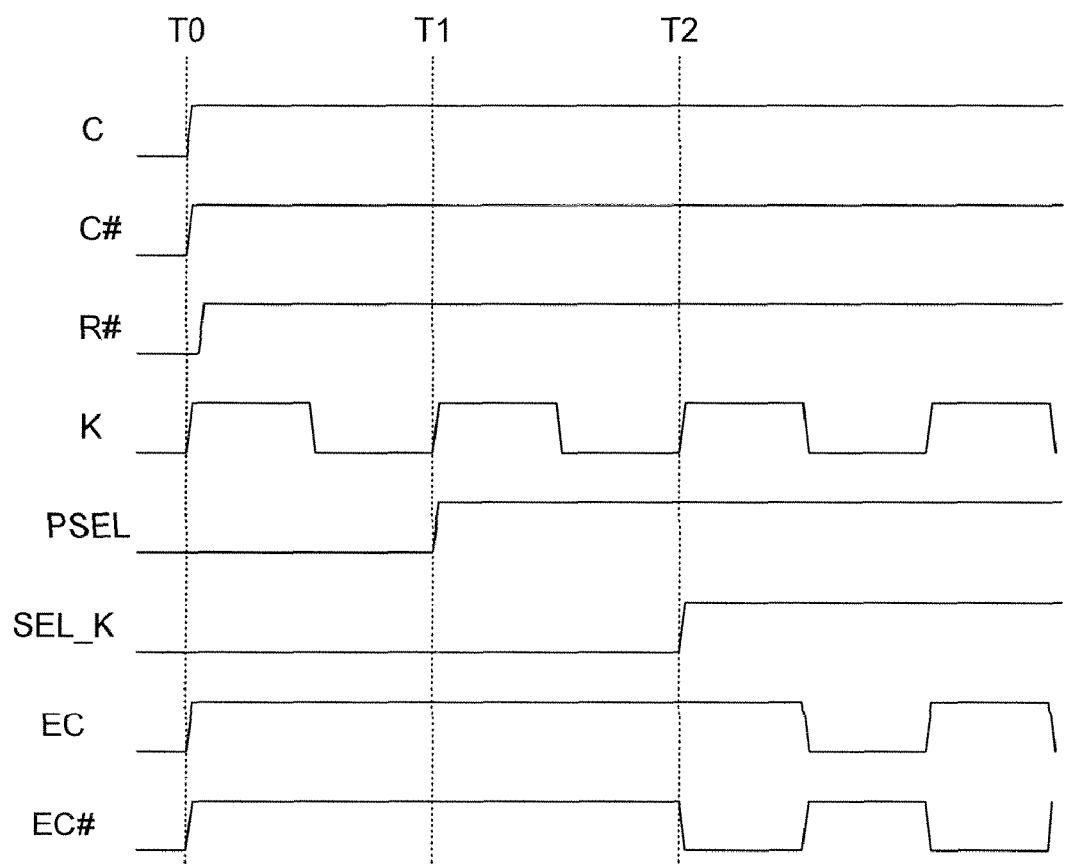
FIG. 5 is a waveform diagram illustrating the operation of the data output clock selection circuit of FIG. 4, when selecting an input clock signal pair K/K# to clock the output data.

FIG. 5 is a waveform diagram illustrating the operation of data output clock selection circuit 400 when both output clock signals C and C# are tied to a logic '1' state after system power up. Prior to time T0, circuit 400 is subject to power on reset (POR) conditions. During power on reset, it is assumed that both output clock signals C and C# are held at a logic '0' state. As a result, the reset control signal R# has a logic '0' state prior to time T0. The logic '0' state of the reset control signal R# resets flip-flops 403 and 404, such that the preliminary select signal PSEL and the select signal SEL_K each has a logic '0' state. Multiplexer 410 initially routes the output clock signal pair C/C# to data output circuit 420 in response to the logic '0' state of the select signal SEL_K.

At time T0, the power on reset operation is complete, and the output clock signals C and C# transition to the fixed logic '1' states, thereby indicating that the input clock signal pair K/K# should be routed to data output circuit 420. In response, NAND gate 401 provides a logic '0' output signal to inverter 402. Inverter 402, in turn, provides a reset control signal R# having a logic '1' state. The logic '1' state of the reset control signal R# allows flip-flops 403 and 404 to latch the data applied to their respective data input terminals (D) in response to rising edges of the applied input clock signal K.

The input clock signals K and K# are also allowed to run beginning at time T0. As shown in FIG. 5, the input clock signal K exhibits a rising edge at time T0 (although this is not necessary). Note that flip-flops 403 and 404 are not enabled at time T0, because the reset signal R# has not yet transitioned to a logic '1' state. Consequently, the rising edge of the input clock signal K at time T0 does not result in a change in the data stored by flip-flops 403 and 404.

The next rising edge of the input clock signal K occurs at time T1. Flip-flop 403 latches a logic '1' data value (i.e., the $V_{DD}$ supply voltage provided at the D input terminal of flip-flop 403) in response to the rising edge of the input clock signal K at time T1. At this time, flip-flop 403 provides a preliminary select signal PSEL having a logic '1' value. The logic '0' value stored in flip-flop 404 is unchanged at this time.

The next rising edge of the input clock signal K occurs at time T2. Flip-flop 404 latches a logic '1' data value (i.e., the logic '1' value provided at the Q output terminal of flip-flop 403) in response to the rising edge of the input clock signal K at time T2. Consequently, the select signal SEL_K transitions to a logic '1' state. Multiplexer 410 routes the input clock signal pair K/K# to data output circuit 420 in response to the logic '1' state of the select signal SEL_K.

Note that once the power on reset is complete, it takes less than two cycles of the input clock signal K for the select signal SEL_K to transition to a logic '1' state. FIG. 5 illustrates what is possibly the slowest transition of the select signal SEL_K. Thus, selection of the complementary input clock signal pair K/K# is relatively fast.

Figure 6:
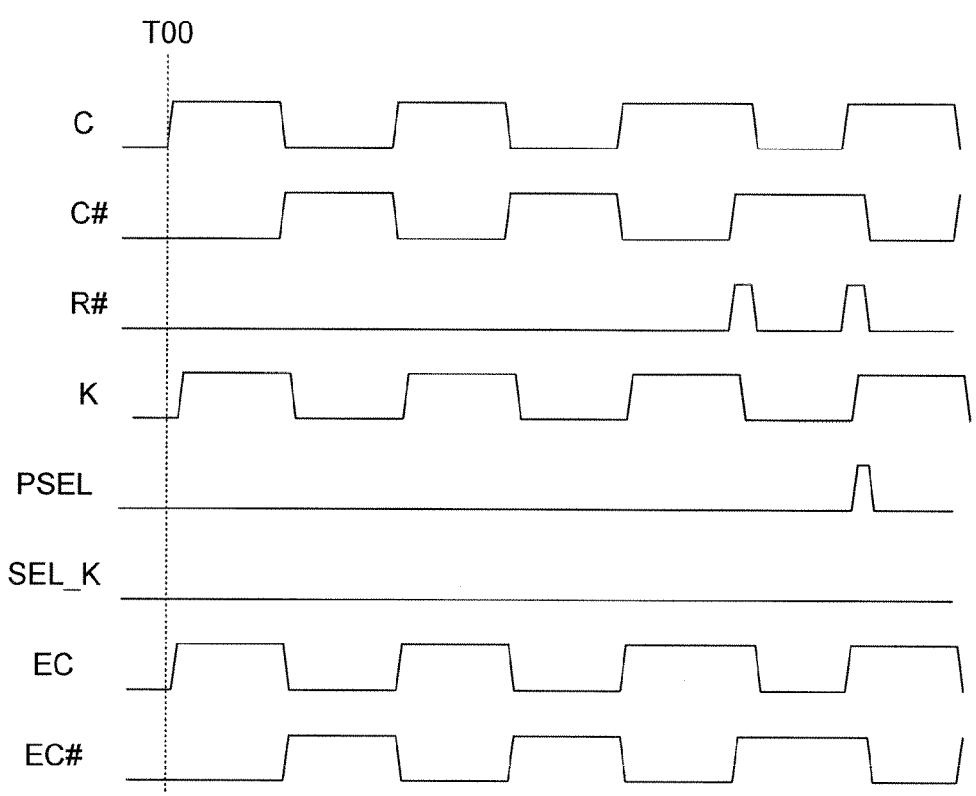
FIG. 6 is a waveform diagram illustrating the operation of the data output clock selection circuit of FIG. 4, when selecting an output clock signal pair C/C# to clock the output data.

FIG. 6 is a waveform diagram illustrating the operation of data output clock selection circuit 400 when the output clock signals C and C# are free running signals after system power up. Prior to time T00, it is assumed that circuit 400 is subject to power on reset (POR) conditions, wherein both output clock signals C and C# are held at a logic '0' state. As described above in connection with FIG. 5, this causes the reset control signal R#, the preliminary select signal PSEL and the select signal SEL_K to have logic '0' states prior to time T00. Multiplexer 410 initially routes the output clock signal pair C/C# to data output circuit 420 in response to the logic '0' state of the select signal SEL_K.

At time T00, the power on reset operation is complete, and the output clock signals C and C# are allowed to transition between logic '0' and logic '1' states, thereby indicating that the output clock signal pair C/C# should be routed to data output circuit 420. The input clock signals K and K# are also allowed to run beginning at time T00. In response to the complementary output clock signals C and C#, NAND gate 401 provides a logic '1' output signal to inverter 402. Inverter 402, in turn, continues to provide a reset control signal R# having a logic '0' state. The logic '0' state of the reset signal R# causes flip-flops 403 and 404 to remain in the reset state. That is, flip-flops 403 and 404 continue to provide logic '0' PSEL and SEL_K output signals, and are not clocked in response to the rising edges of the applied input clock signal K. Multiplexer 410 continues to route the output clock signal pair C/C# to data output circuit 420 in response to the logic '0' state of the select signal SEL_K.

Figure 1:
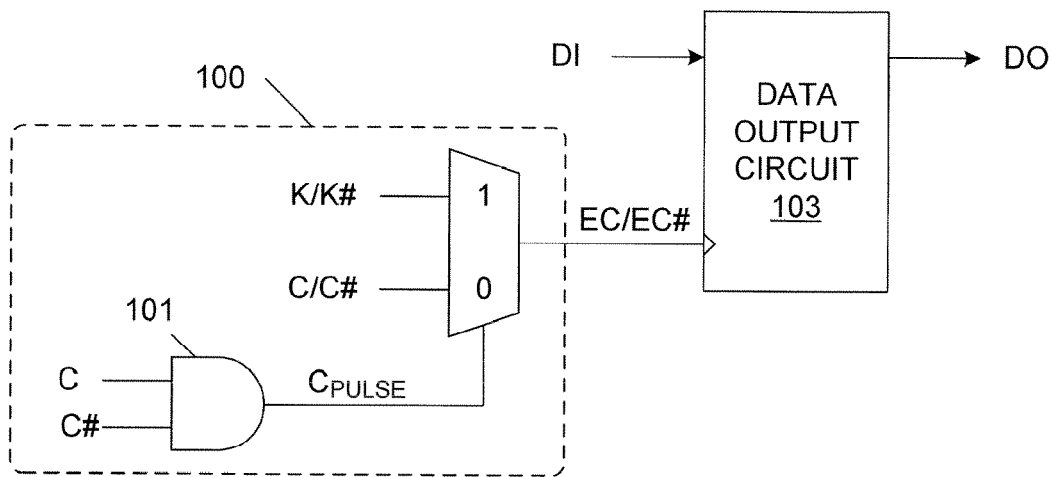
FIG. 1 is a circuit diagram of a conventional data output clock selection circuit.
Figure 2:
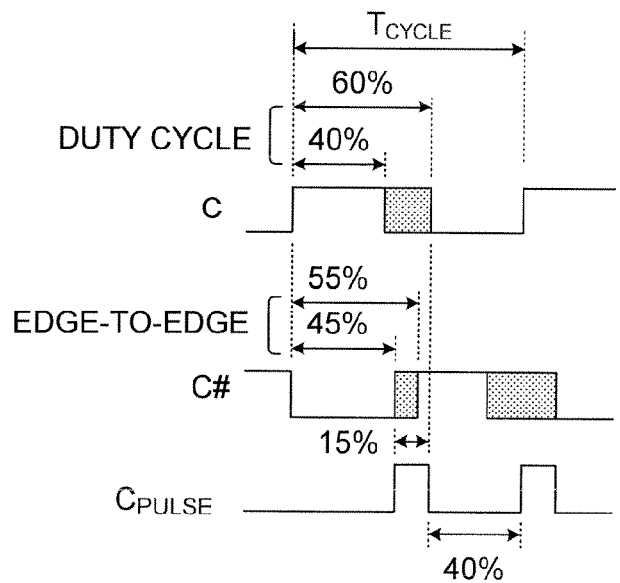
FIG. 2 is a waveform diagram illustrating potential glitches in the data output clock selection circuit of FIG. 1.
Figure 3:
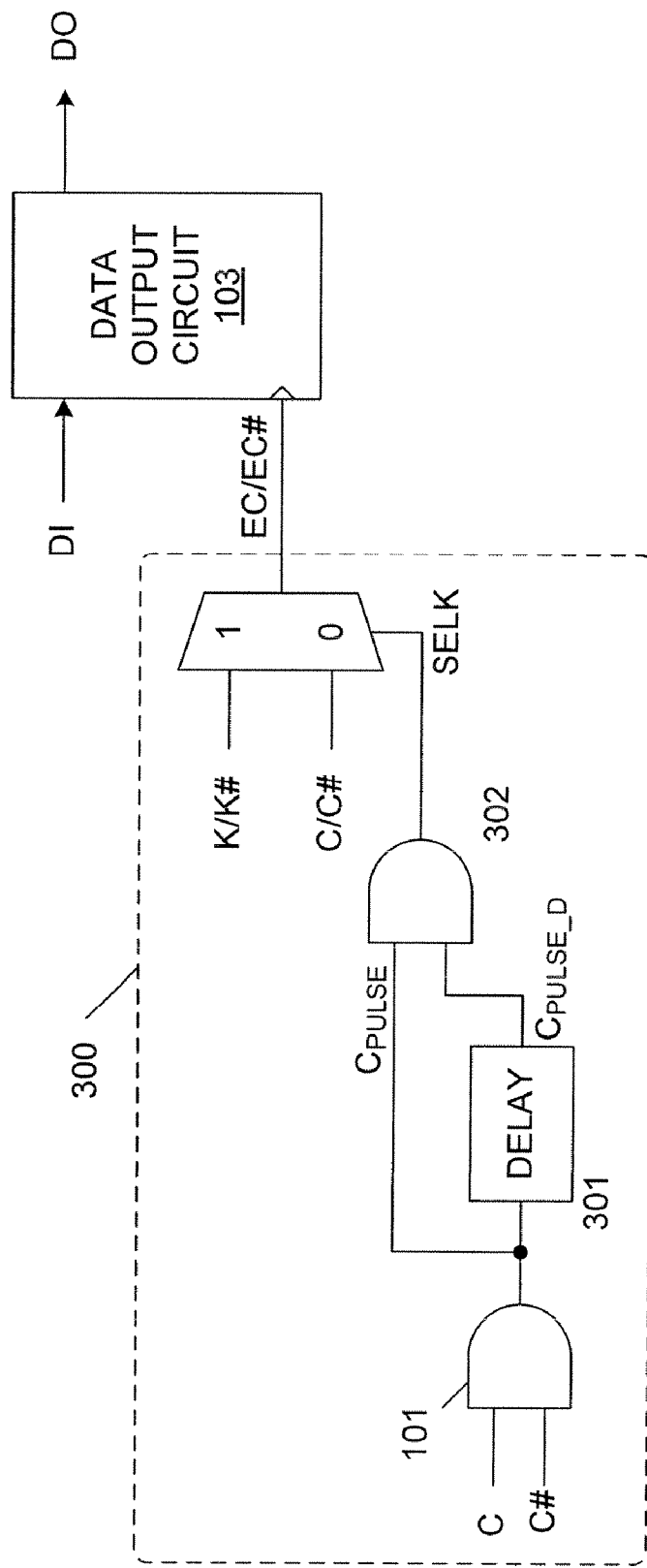
FIG. 3 is a circuit diagram of a conventional data output clock selection circuit, which attempts to eliminate the potential glitches illustrated by FIG. 2.

Note that the complementary output clock signals C and C# may simultaneously exhibit logic '1' states during normal operation of circuit 400 (see, e.g., FIG. 2). During these times, the reset control signal R# will have a logic '1' state (i.e., the reset control signal R# is deactivated). However, in accordance with the clock signal specifications, the reset control signal R# will only have a logic '1' state for a duration less than or equal to $0.15 \times T_{CYCLE}$, where $T_{CYCLE}$ is the period of the clock signal C (or C#). Moreover, the time between consecutive logic '1' pulses of the reset control signal R# is less than or equal to $0.4 \times T_{CYCLE}$.

By specification, the input clock signals K and K# have the same frequency as the output clock signals C and C#. Consequently, the reset control signal R# must have a logic '1' state for more than one period $T_{CYCLE}$ in order for the select signal SEL_K to transition to a logic '1' state (and thereby create a potential glitch in the output clock signal EC/EC#). That is, the reset control signal R# must remain in a logic '1' state for at least two consecutive rising edges of the input clock signal K in order for a logic '1' signal to be propagated through flip-flops 403 and 404. However, this will never occur, because the reset control signal R# can only have a logic '1' state for a duration of $0.15 \times T_{CYCLE}$. As illustrated at in FIG. 6, pulses in the reset control signal R# may cause the preliminary select signal PSEL to briefly transition to a logic '1' state. However, the duration of the logic '1' state of the preliminary select signal is not long enough to effect the logic '0' state of the select signal SEL_K.

Advantageously, standard variations in the output clock signals C and C# will not cause undesired transitions in the select signal SEL_K. Data output clock selection circuit 400 advantageously works for all frequencies of the input clock signal pair K/K# and the output clock signal pair C/C#. That is, data output clock selection circuit 400 is not frequency limited. Data output clock selection circuit 400 also advantageously consumes minimal layout area and power, because no delay chain is required. Moreover, data output clock selection circuit 400 can be easily fabricated, independent of the process used. That is, circuit 400 can be implemented with logic elements of a standard cell library.

Although combinational logic circuit 411 has been described as having a logical AND function (i.e., NAND gate 401 followed by inverter 402), it is understood that combinational logic circuit 411 can have other functions in other embodiments. For example, combinational logic circuit 411 may implement a logical exclusive NOR function in another embodiment of the present invention. In this embodiment, free running output clock signals C and C# will cause the reset signal R# to have a logic '0' state, thereby causing the output clock signal pair C/C# to be routed as the clock signal pair EC/EC#. When the output clock signals C and C# are both fixed at the same value (i.e., both logic '0' or both logic '1'), the reset signal R# will have a logic '1' state, thereby causing the input clock signal pair K/K# to be routed as the clock signal pair. The logical exclusive NOR function of this embodiment can be viewed as a combination of a logical NOR function and a logical AND function.

In yet another embodiment, combinational logic circuit 411 can implement a logical NOR function. In this embodiment, free running output clock signals C and C# will cause the reset signal R# to have a logic '0' state, thereby causing the output clock signal pair C/C# to be routed as the clock signal pair EC/EC#. Similarly, when the output clock signals C and C# are both fixed at a logic '1' value, the reset signal R# will have a logic '0' state, thereby causing the output clock signal pair C/C# will be routed as the clock signal pair EC/EC#. However, when the output clock signals C and C# are both fixed at a logic '0' value, the reset signal R# will have a logic '1' state, thereby enabling the input clock signal pair K/K# to be routed as the clock signal pair EC/EC#.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

I claim:

1. A data output clock selection circuit comprising:
    a combinational logic circuit configured to receive a first signal pair, and in response, provide a reset control signal that is deactivated when both signals of the first signal pair have a first predetermined logic state, and provide a reset control signal that is activated when the signals of the first signal pair have complementary logic states;
    a first sequential logic circuit configured to receive the reset control signal, a control clock signal and a fixed signal, and in response provide a preliminary clock select signal;
    a second sequential logic circuit configured to receive the reset control signal, the control clock signal and the preliminary clock select signal, and in response, provide a clock select signal;
    a multiplexer coupled to receive the first signal pair, a second signal pair, and the clock select signal, the multiplexer being configured to route the first or second signal pair to clock a data output circuit in response to the clock select signal.

2. The data output clock selection circuit of claim 1, wherein the combinational logic circuit is configured to implement a logical AND function.

3. The data output clock selection circuit of claim 1, wherein the combinational logic circuit is configured to implement a logical NOR function.

4. The data output clock selection circuit of claim 1, wherein the first and second sequential logic circuits comprise flip-flops having asynchronous reset terminals configured to receive the reset control signal.

5. The data output clock selection circuit of claim 1, wherein the first sequential logic circuit configured to provide a preliminary clock select signal having a logic state opposite a logic state of the fixed signal if the reset control signal is activated.

6. The data output clock selection circuit of claim 5, wherein the first sequential logic circuit is configured to latch the fixed signal in response to the control clock signal if the reset control signal is deactivated.

7. The data output clock selection circuit of claim 6, wherein the second sequential logic circuit is configured to provide a clock select signal having the logic state opposite the logic state of the fixed signal if the reset control signal is activated.

8. The data output clock selection circuit of claim 7, wherein the second sequential logic circuit is configured to latch the preliminary clock select signal in response to the control clock signal if the reset control signal is deactivated.

9. The data output clock selection circuit of claim 1, wherein the second signal pair comprises a clock signal which is used as the control clock signal.

10. The data output clock selection circuit of claim 1, wherein the first signal pair comprises a complementary pair of output clock signals, and the second signal pair comprises a complementary pair of input clock signals.

11. The data output clock selection circuit of claim 1, wherein the combinational logic circuit is further configured to provide a reset control signal that is deactivated when both signals of the first signal pair have a second predetermined logic state, opposite the first predetermined logic state.

12. A method for selecting a data output clock signal, the method comprising:
    activating a reset control signal with a combinational logic circuit if clock signals of a first clock signal pair have different values;
    de-activating the reset control signal with the combinational logic circuit if both the clock signals of the first clock signal pair have a first predetermined logic state;
    asynchronously resetting a first sequential logic circuit and a second sequential logic circuit if the reset control signal is activated;
    synchronously latching a fixed value into the first sequential logic circuit in response to a control clock signal if the reset control signal is deactivated;
    synchronously latching an output data value provided by the first sequential logic circuit into the second sequential logic circuit in response to the control clock signal if the reset control signal is deactivated; and
    selecting the data output clock signal from the first clock signal pair and a second clock signal pair in response to an output data value provided by the second sequential logic circuit.

13. The method of claim 12, wherein the clock signals of the first clock signal pair and the control clock signal have the same frequency.

14. The method of claim 12, wherein the clock signals of the first clock signal pair and the second clock signal pair have the same frequency.

15. The method of claim 12, wherein the control clock signal comprises a clock signal from the second clock signal pair.

* * * * *